US005712607A

United States Patent [19]

Dittmer et al.

[11] Patent Number: 5,712,607

[45] Date of Patent: Jan. 27, 1998

[54] AIR-DIELECTRIC STRIPLINE

[76] Inventors: Timothy W. Dittmer, R. 1 Box 126; George Cabrera, 61 Lincoln Hill N.E., both of Quincy, Ill. 62301; Dale J. Doyle, 43395 Corte Durazo, Temecula, Calif. 92592

[21] Appl. No.: 631,580

[22] Filed: Apr. 12, 1996

[51] Int. Cl.[6] ........ H01P 3/08

[52] U.S. Cl. ........ 333/238; 333/246

[58] Field of Search ........ 333/116, 238, 333/246, 128, 161, 204

[56] References Cited

U.S. PATENT DOCUMENTS

| | | | |
|---|---|---|---|
| 2,812,501 | 11/1957 | Sommers | 333/238 |
| 2,913,686 | 11/1959 | Fubini et al. | 333/238 |
| 4,614,922 | 9/1986 | Bauman et al. | 333/161 |

*Primary Examiner*—Paul Gensler
*Attorney, Agent, or Firm*—Tarolli, Sundheim, Covell, Tummino & Szabo

[57] ABSTRACT

An air-dielectric stripline is provided which includes top, intermediate and bottom planar dielectric layers spaced from each other in parallel planes with each layer having upper and lower oppositely directed faces. First and second electrically conductive planar ground planes are respectively attached to the lower surface of the top dielectric layer and the upper surface of the bottom dielectric layer. First and second planar dielectric spacer layers are respectively located between the top and intermediate dielectric layers and the intermediate and bottom dielectric layers for maintaining a given spacing therebetween. Each spacer layer has a channel formed therein to thereby define upper and lower air chambers on opposing faces of the intermediate layer. A conductive inner trace is attached to at least one face of the intermediate layer within one of the chambers and is spaced from an associated ground plane by the thickness of a spacer dielectric layer.

13 Claims, 1 Drawing Sheet

AIR-DIELECTRIC STRIPLINE

FIELD OF THE INVENTION

The present invention relates to the art of transmission lines and, more particularly, to an improved air-dielectric stripline.

DESCRIPTION OF THE PRIOR ART

Transmission lines are known in the art for use in conducting electrical signals. Transmission lines are frequently employed for radio frequency signals.

Radio frequency transmission lines frequently take the form of striplines. A stripline includes a conductor that is suspended between two ground planes. If the dielectric between the conductor and each of the ground planes is air, then the stripline is known as an air-dielectric stripline.

An air-dielectric stripline known in the prior art is disclosed in the U.S. Patent to Bauman et al. 4,614,922. This patent discloses an upper housing and a lower housing each having a channel formed therein with the channels facing each other. The housings are constructed of metal and the channels are formed as by machining or die casting. A substrate of insulating material of the type employed for printed circuit boards is located between the housings defining upper and lower air chambers. This substrate carries an upper conductor and a lower conductor which are interconnected together by suitable vias so that the two conductors are at the same electrical potential. The conductors are thus suspended in the metal housings with the conductors being spaced vertically from the housings by air. The roof of the upper housing serves as an upper ground plane and the floor of the lower housing serves as a lower ground plane. The ground planes are electrically connected together. A notable disadvantage of such a stripline construction is the complexity and expense of forming of the channels in the housings.

It is an object of the present invention to provide a suspended air-dielectric stripline of simpler construction than that of the prior art discussed above.

SUMMARY OF THE INVENTION

In accordance with the invention, an air-dielectric stripline is provided which includes top, intermediate and bottom planar dielectric layers spaced from each other in parallel planes with each layer having upper and lower oppositely directed faces. First and second electrically conductive planar ground planes are respectively attached to the lower surface of the top dielectric layer and the upper surface of the bottom dielectric layer. First and second planar dielectric spacer layers are respectively located between the top and intermediate dielectric layers and the intermediate and bottom dielectric layers for maintaining a given spacing therebetween. Each spacer layer has a channel formed therein to thereby define upper and lower air chambers on opposing faces of the intermediate layer. A conductive inner trace is attached to at least one face of the intermediate layer within one of the chambers and is spaced from an associated ground plane by the thickness of a spacer dielectric layer.

BRIEF DESCRIPTION OF THE DRAWINGS

The foregoing and other objects of the invention will become more readily apparent from the following description of the preferred embodiment of the invention as taken in conjunction with the accompanying drawings which are apart hereof and wherein.

DESCRIPTION OF PREFERRED EMBODIMENT

Reference is now made to the drawings wherein the showings are for purposes of illustrating a preferred embodiment of the invention only, and not for the purpose of limiting same.

Figure 1:
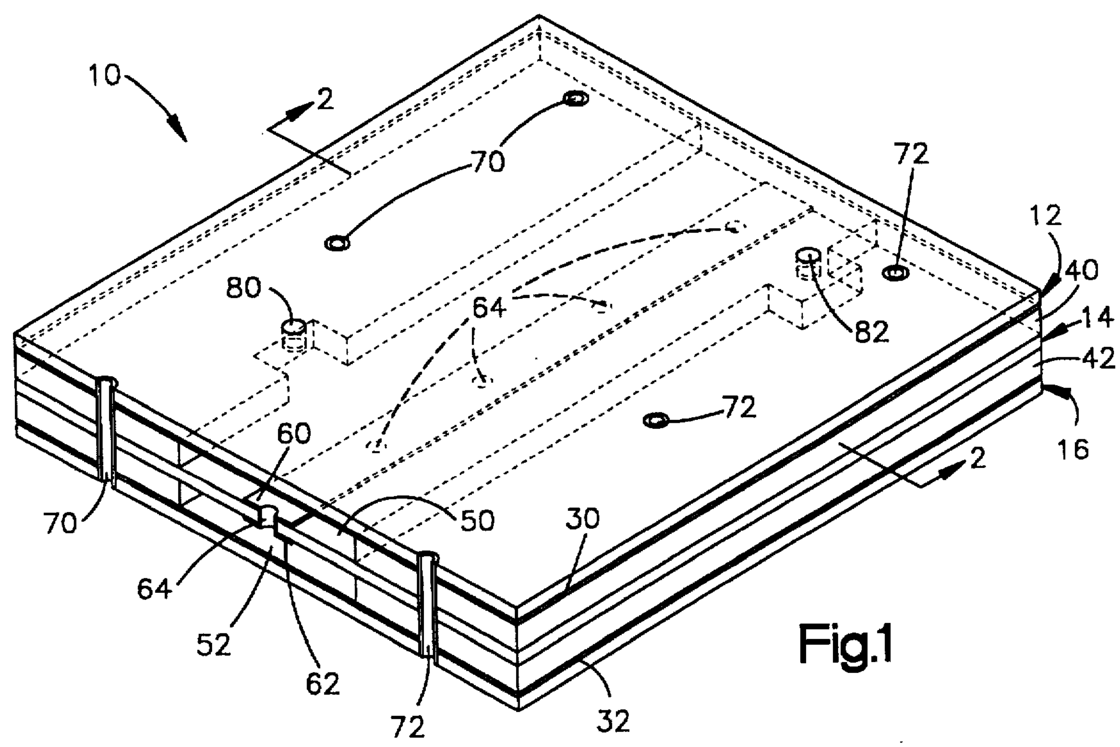
FIG. 1 is a perspective view illustrating one embodiment in accordance with the present invention.
Figure 2:
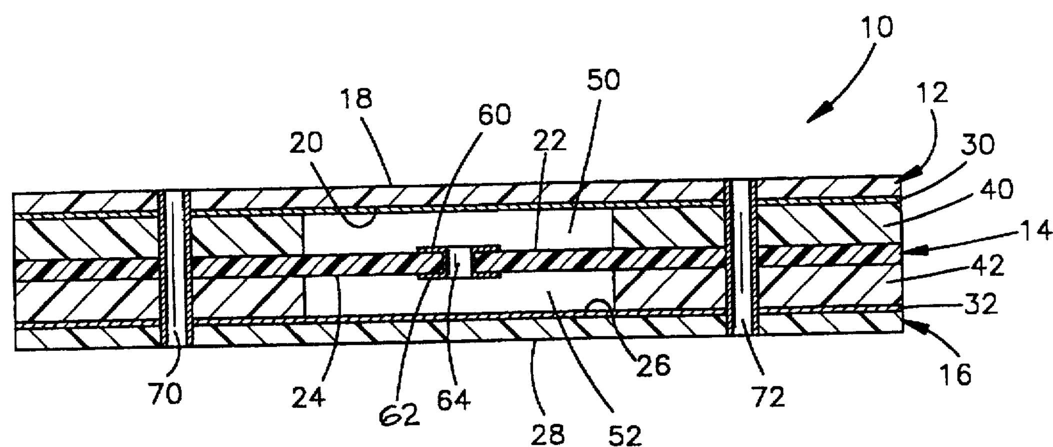
FIG. 2 is a sectional view taken generally along line 2—2 looking in the direction of the arrows in FIG. 1.

The air-dielectric stripline 10 is illustrated in FIGS. 1 and 2 and includes a laminated structure including a plurality of planar dielectric layers constructed of suitable non-conductive material of the type used for printed circuit boards. This structure includes a top dielectric layer 12, an intermediate dielectric layer 14 and a bottom dielectric layer 16. These layers are spaced from each other in parallel planes with layer 14 being located intermediate layers 12 and 16. These are relatively thin layers and, for example, may each have a thickness on the order of 20 mils. Each of these layers has upper and lower oppositely directed faces. Thus, layer 12 has an upper face 18 and a lower face 20. Layer 14 has an upper face 22 and a lower face 24. Layer 16 has an upper face 26 and a lower face 28.

Ground planes 30 and 32 are respectively attached to layers 12 and 16. Each ground plane takes the form of a thin metal layer which is initially applied to one face of a dielectric layer. In the example being presented, each layer may be on the order of 1 mil in thickness. Ground plane 30 is attached to the lower face 20 of the top layer 12 whereas ground plane 32 is attached to the upper face 26 of bottom layer 16. Ground plane 30 is spaced from the upper face 22 of layer 14 by means of a planar dielectric spacer layer 40. Similarly, ground plane 32 is spaced from the lower face 24 of layer 14 by means of a planar dielectric spacer layer 42. Layers 40 and 42 may be constructed of the same material as that of layers 12, 14 and 16. However, layers 40 and 42 are somewhat thicker and, in the example being presented, may each be on the order of 100 mils in thickness.

A channel is formed in each of the spacer layers 40 and 42. Thus, a channel 50 of rectangular cross-section, as viewed in FIG. 2, is formed in spacer layer 40 and extends longitudinally (into the paper). This channel together with layers 12 and 14, defines an air chamber. Similarly, a channel 52 is formed in spacer layer 42.

An upper conductive inner trace 60 is attached to the upper face 22 of the intermediate layer 14. A lower conductive inner trace 62 in registry with trace 60 is attached to the lower surface 24 of layer 14. The traces 60 and 62 are located centrally within channels 50 and 52 and extend in a longitudinal direction (into the paper). The traces are interconnected by longitudinally spaced vias 64 which extend between the traces through the intermediate layer 14. The vias 64, as is well known in the art, take the form of conductive plated through holes in layer 14. These vias 64 place the conductive traces 60 and 62 at equal electrical potentials.

Ground planes 30 and 32 are also electrically interconnected together by vias 70 and 72. It is to be understood that there are a plurality of longitudinally spaced vias 70 and 72 interconnecting the two ground planes.

The voltage gradients of the stripline are primarily across the air-dielectric in channels 50 and 52, minimizing contribution from the solid layers.

Air cooling of the stripline may be obtained by air flowing through channels 50 and 52. This may be assisted by providing a pressurized source of air and connecting it to a suitable inlet passage 80 in layer 12 so that air may flow into the chamber 50 and thence longitudinally along the upper trace 60 and exit as through an exit passageway 82. It is to be understood that a similar inlet passageway and exit passageway are provided in layer 16 for connection with channel 52.

The air-dielectric stripline, described above, may be manufactured using conventional printed wiring board (PWB) fabrication techniques. This preserves much of the low-cost characteristics of PWBs while attaining a low-dielectric constant which is close to 1.0 and subsequent low conductor losses of the air-dielectric stripline, The construction also allows for high power transmission, by a forced-air cooling of the stripline by air flowing through channels 50 and 52 during operation.

The construction of the stripline may be accomplished in the following manner. The intermediate dielectric layer 14 may be initially metalized on both its upper face 22 and its lower face 24. The conductive traces 60 and 62 may then be formed by etching away metal from layer 14 by suitable techniques well known in the art. Thereafter, the plurality of longitudinally spaced vias may be formed to electrically connect traces 60 and 62. The bottom layer 16 may be provided with its upper face 26 metalized to provide the ground plane 32. Also, the upper layer 12 may have its lower surface 20 metalized to provide the ground plane 30. Spacer layers 40 and 42 may then have channels 50 and 52 formed therein, as by milling. The assembly is then put together as shown in FIG. 2. A plurality of longitudinally spaced vias 70 may then be formed so as to electrically interconnect ground planes 30 and 32. Also, longitudinally spaced vias 72 are formed for interconnecting ground planes 30 and 32. Thereafter, the assembly may be suitably heated so that bonding agents and the like will cause the assembly to be bonded together.

In an alternative arrangement, layers 12 and 40 may be integral as a single layer with channel 50 formed therein. The roof of the channel would have attached thereto a ground plane, such as plane 30. Also, layers 16 and 42 may be integral as a single layer with a channel 52 formed therein. The floor of this channel would have attached thereto a ground plane, such as plane 32. The ground planes would be interconnected as by vias.

From the above description of the invention, those skilled in the art will perceive improvements, changes and modifications. Such improvements, changes and modifications within the skill of the art are intended to be covered by the appended claims.

Having described the invention, we claim the following:

1. An air-dielectric stripline multiple solid layer laminated structure comprising:

top, intermediate, and bottom planar dielectric layers spaced from each other in parallel planes with said intermediate layer being located intermediate said top and bottom layers and each layer having upper and lower oppositely directed faces;

first and second electrically conductive planar ground planes respectively attached to the lower surface of said top layer and the upper surface of said bottom layer;

first and second planar dielectric spacer layers respectively located between said top and intermediate layers and said intermediate and bottom layers for maintaining said spacing between said top, intermediate, and bottom layers;

each said spacer layer having an airtight channel formed therein with longitudinally extending solid sidewalls in said spacer defining upper and lower air chambers on opposing faces of said intermediate layer, said channel allowing for forced-air cooling by air following through said channel during operation; and a conductive inner trace attached to a least one face of said intermediate layer within a said chamber and spaced from an associated ground plane by the thickness of a said spacer dielectric layer.

2. A stripline as set forth in claim 1 wherein said conductive trace is a first trace and is attached to the upper face of said intermediate layer.

3. A stripline as set forth in claim 2 including a second electrically conductive inner trace attached to the lower face of said intermediate layer.

4. A stripline as set forth in claim 3 wherein said first and second traces are parallel to each other.

5. A stripline as set forth in claim 3 including means for electrically interconnecting said first and second traces so as to be at substantially the same electrical potential.

6. A stripline as set forth in claim 5 wherein said means for interconnecting includes a plurality of conductive vias extending from said first trace to said second trace through said intermediate layer.

7. A stripline as set forth in claim 6 including means for electrically interconnecting first and second ground planes so as to be at substantially the same electrical potential.

8. A stripline as set forth in claim 7 wherein said means for connecting said first and second ground planes includes a plurality of electrically conductive vias extending between said ground planes through said spacer dielectric layers and said intermediate dielectric layer.

9. An air-dielectric stripline multiple solid layer laminated structure comprising:

top, intermediate, and bottom planar dielectric layers in parallel planes with said intermediate layer being located intermediate said top and bottom layers and each layer having upper and lower oppositely directed faces;

first and second electrically conductive planar ground planes respectively attached to at least a portion of the lower surface of said top layer and at least a portion of the upper surface of said bottom layer;

first and second dielectric spacers respectively located between said top and intermediate layers and said intermediate and bottom layers;

each said spacer having an airtight channel formed therein with longitudinally extending solid sidewalls in said spacer defining upper and lower air chambers on opposing faces of said intermediate layer, said channel allowing for forced-air cooling by air flowing through said channel during operation; and a conductive inner trace attached to a least one face of said intermediate layer within a said chamber and spaced from an associated ground plane by the thickness of a said spacer.

10. A laminate-based air-dielectric stripline circuit board formed as a unitary article, comprising:

a multiple layer laminated dielectric structure including a spacer dielectric layer positioned between a first dielectric layer having first inner and outer surfaces and a second dielectric layer having second inner and outer surfaces, the laminated dielectric structure having an interior and two side margins that define a width and two side margins that define a length;

an electrically conductive trace attached to one of the first inner and outer surfaces of the first dielectric layer, the trace positioned medially of the two side margins that define the width of the laminated dielectric structure and extending along the length of the laminated dielectric structure;

an electrically conductive reference plane attached to at least a portion of one of the second inner and outer surfaces of the second dielectric layer; and an air gap in the spacer dielectric layer and spatially aligned with the electrically conductive trace, the air gap forming in the interior and along the length of the laminated dielectric structure an airtight channel that longitudinally divides the spacer dielectric layer to provide across the air gap a dielectric constant discontinuity in the interior of the laminated dielectric structure, the channel being defined by longitudinally extending solid sidewalls in the spacer dielectric layer and the channel allowing for forced-air cooling by air flowing through said channel during operation.

11. An article as set forth in claim 10 wherein said conductive trace is attached to said first inner surface of said first dielectric layer.

12. An article as set forth in claim 10 wherein said conductive trace is attached to said second inner surface of said first dielectric layer.

13. An article as set forth in claim 10 wherein said ground plane is attached to said inner surface of said second dielectric layer.

* * * * *